(12) United States Patent
Lin et al.

(10) Patent No.: US 11,089,703 B2
(45) Date of Patent: Aug. 10, 2021

(54) POWER CONVERTER

(71) Applicant: Chicony Power Technology Co., Ltd., New Taipei (TW)

(72) Inventors: Ming-Hui Lin, New Taipei (TW); Po-Sheng Lee, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/909,998

(22) Filed: Jun. 23, 2020

(65) Prior Publication Data

US 2021/0219436 A1 Jul. 15, 2021

(30) Foreign Application Priority Data

Jan. 10, 2020 (TW) .................. 10910085.6

(51) Int. Cl.
*H05K 5/00* (2006.01)
*H05K 9/00* (2006.01)
*H05K 5/02* (2006.01)

(52) U.S. Cl.
CPC ........... *H05K 5/003* (2013.01); *H05K 5/0047* (2013.01); *H05K 5/0086* (2013.01); *H05K 5/0247* (2013.01); *H05K 9/0037* (2013.01)

(58) Field of Classification Search
USPC ....................................................... 361/753
See application file for complete search history.

(56) References Cited

U.S. PATENT DOCUMENTS

| 4,226,491 A | 10/1980 | Kazama et al. |
| 9,795,047 B1 | 10/2017 | Lee et al. |

| 2013/0058060 A1 | 3/2013 | Jang et al. | |
| 2013/0105292 A1 | 5/2013 | Rochlitz et al. | |
| 2016/0095233 A1* | 3/2016 | Kusumi | H05K 5/0017 361/756 |
| 2017/0156229 A1* | 6/2017 | Yilmaz | H05K 5/064 |
| 2017/0172020 A1* | 6/2017 | Ye | H05K 9/0084 |

(Continued)

FOREIGN PATENT DOCUMENTS

| CN | 2726275 Y | 9/2005 |
| CN | 200969459 Y | 10/2007 |
| CN | 205040119 U | 2/2016 |

(Continued)

OTHER PUBLICATIONS

Office Action dated Aug. 25, 2020 of the corresponding Taiwan patent application No. 109100856.

*Primary Examiner* — Hung S. Bui

(74) *Attorney, Agent, or Firm* — Chun-Ming Shih; HDLS IPR Services

(57) ABSTRACT

A power converter includes a tubular housing having an accommodation space, a first and a second openings. A power module is disposed in the accommodation space and includes a circuit board and a first fastening portion. A bottom cover is formed with a second fastening portion and first bumps, and the bottom cover is pre-positioned on the tubular housing through the second fastening portion engaged with the first fastening portion. A bottom cover is bonded to the first opening through melting the first bumps by ultrasonic welding. A power cable is inserted through the bottom cover and electrically connected to the circuit board. A power socket is coupled to the second opening.

11 Claims, 11 Drawing Sheets

(56) References Cited

U.S. PATENT DOCUMENTS

2019/0044452 A1* 2/2019 Arita .................. F21V 15/013
2019/0200474 A1* 6/2019 Miura ................ H05K 7/1439

FOREIGN PATENT DOCUMENTS

| CN | 205388929 U | 7/2016 |
| TW | M324386 U | 12/2007 |
| TW | I514190 B | 12/2015 |

* cited by examiner

POWER CONVERTER

BACKGROUND OF THE INVENTION

Field of the Invention

The present invention generally relates to a power device and in particular to a power converter.

Description of Prior Art

Generally speaking, the structure of a power converter mainly includes a converter body, a power socket and a conductive plug etc., wherein the converter body is equipped with components such as a transformer inductor, electronic parts and a circuit board installed in a housing. Besides, one end of the housing has combined with the power socket and the other end is combined with a back cover. At last, the conductive plug is inserted through the back cover to connect with the circuit board to complete the assembly of the power converter.

In the structure of the above power converter, the back cover and the housing are usually tightly combined by ultrasonic welding. As the conductive plug has a certain weight, when the conductive plug is inserted through the back cover to connect the circuit board, the back cover will be deflected and displaced due to the weight of the conductive plug, so that the back cover cannot be stably pre-fixed on the housing. As a result, the ultrasonic welding cannot be performed smoothly. For this, existing power converters are currently formed with hooks on inner walls of two sides of the housing for fastening the back cover to prevent deflection and movement. However, the design of forming hooks on the inner walls of the two sides of the housing will make the thickness of the housing uneven, so that stress marks are easily generated after injection molding which cannot meet the appearance requirements and needs to be improved.

In view of the above drawbacks, the inventor proposes the present invention based on his expert knowledge and elaborate researches in order to solve the problems of prior art.

SUMMARY OF THE INVENTION

Accordingly, an object of the present invention is to provide a power converter to prevent the back cover from deflecting and displacing, and the housing will not have stress marks to keep a good aesthetics.

In order to achieve the object mentioned above, the present invention provides a power converter comprising a tubular housing, a power module, a bottom cover, a power cable and a power socket. The tubular housing has an accommodation space and a first opening and a second opening located opposite to the accommodation space. The power module is disposed in the accommodation space. The power module includes a circuit board and a plurality of electronic components arranged on the circuit board, and the circuit board is provided with a first fastening portion. The bottom cover has a docking opening, a second fastening portion formed on a side facing the accommodation space, and a plurality of first bumps provided as welding line. The bottom cover is pre-positioned on the tubular housing through the second fastening portion engaged with the first fastening portion, and the bottom cover is bonded to the first opening through melting the first bumps by ultrasonic welding. The power cable is inserted through the docking opening to electrically connect with the circuit board. The power socket is combined in the second opening of the tubular housing.

Comparing to the prior art, the circuit board of the power converter has provided with the first fastening portion; in addition, the bottom cover is formed with the second fastening portion Therefore, the bottom cover is pre-positioned on the tubular housing through the second fastening portion engaged with the first fastening portion. Moreover, the bottom cover has formed with a supporting portion for abutting a side of the circuit board to replace the design of forming hooks on the inner walls of the two sides of the housing of traditional power converters; thus, the circuit board can be prevented from deflecting under uneven weight. Furthermore, the assembly of the power converter of the present invention does not have stress marks on the outer surfaces, so that the tubular housing can have a good aesthetics, and the practicality of the present invention are enhanced.

BRIEF DESCRIPTION OF DRAWINGS

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

DETAILED DESCRIPTION OF THE PREFERRED EMBODIMENTS

In cooperation with attached drawings, the technical contents and detailed description of the invention are described thereinafter according to a number of preferable embodiments, being not used to limit its executing scope. Any equivalent variation and modification made according to appended claims is all covered by the claims claimed by the present invention.

Figure 1:
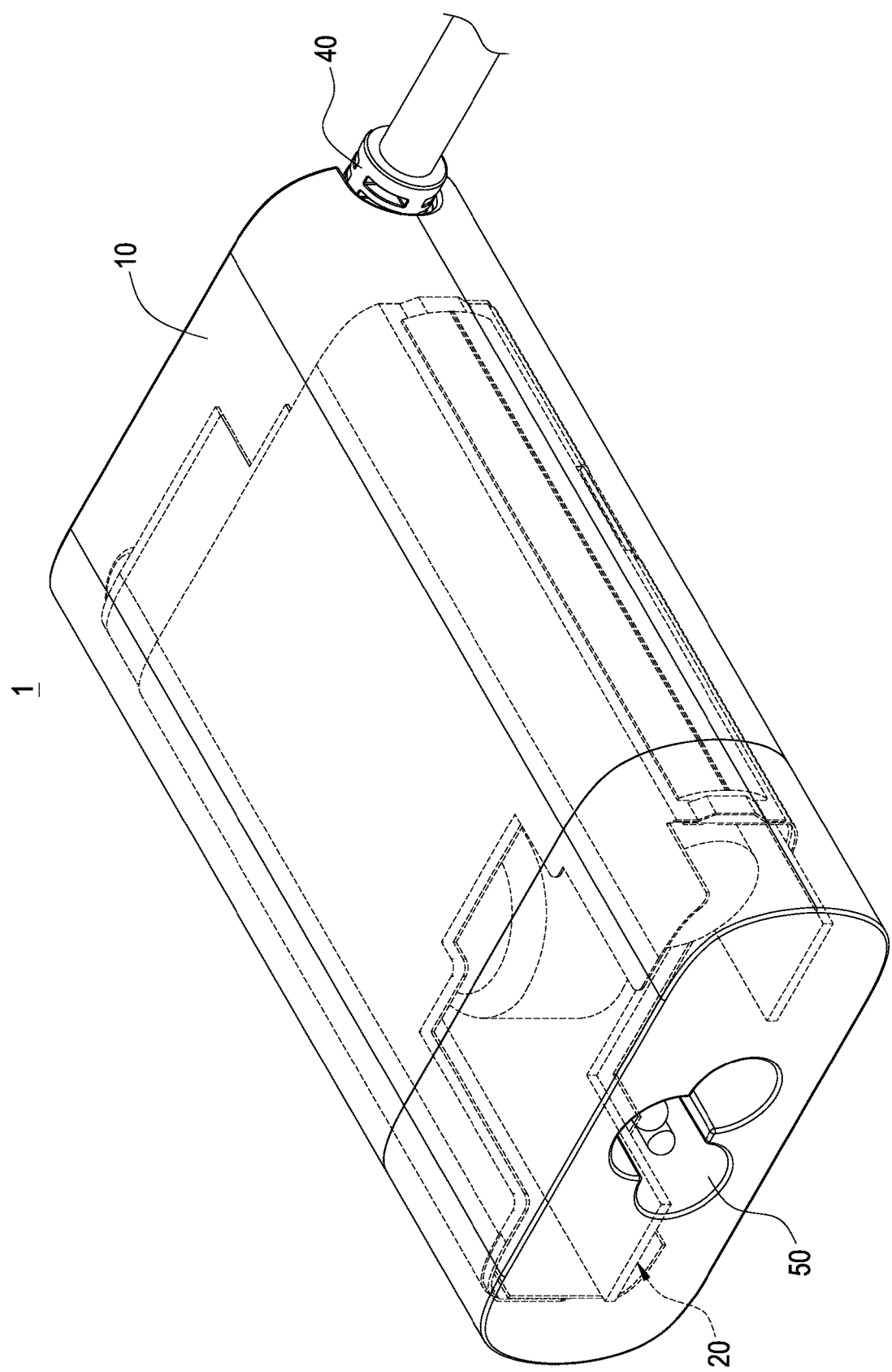
FIG. 1 is a perspective schematic view of the power converter of the present invention.
Figure 2:
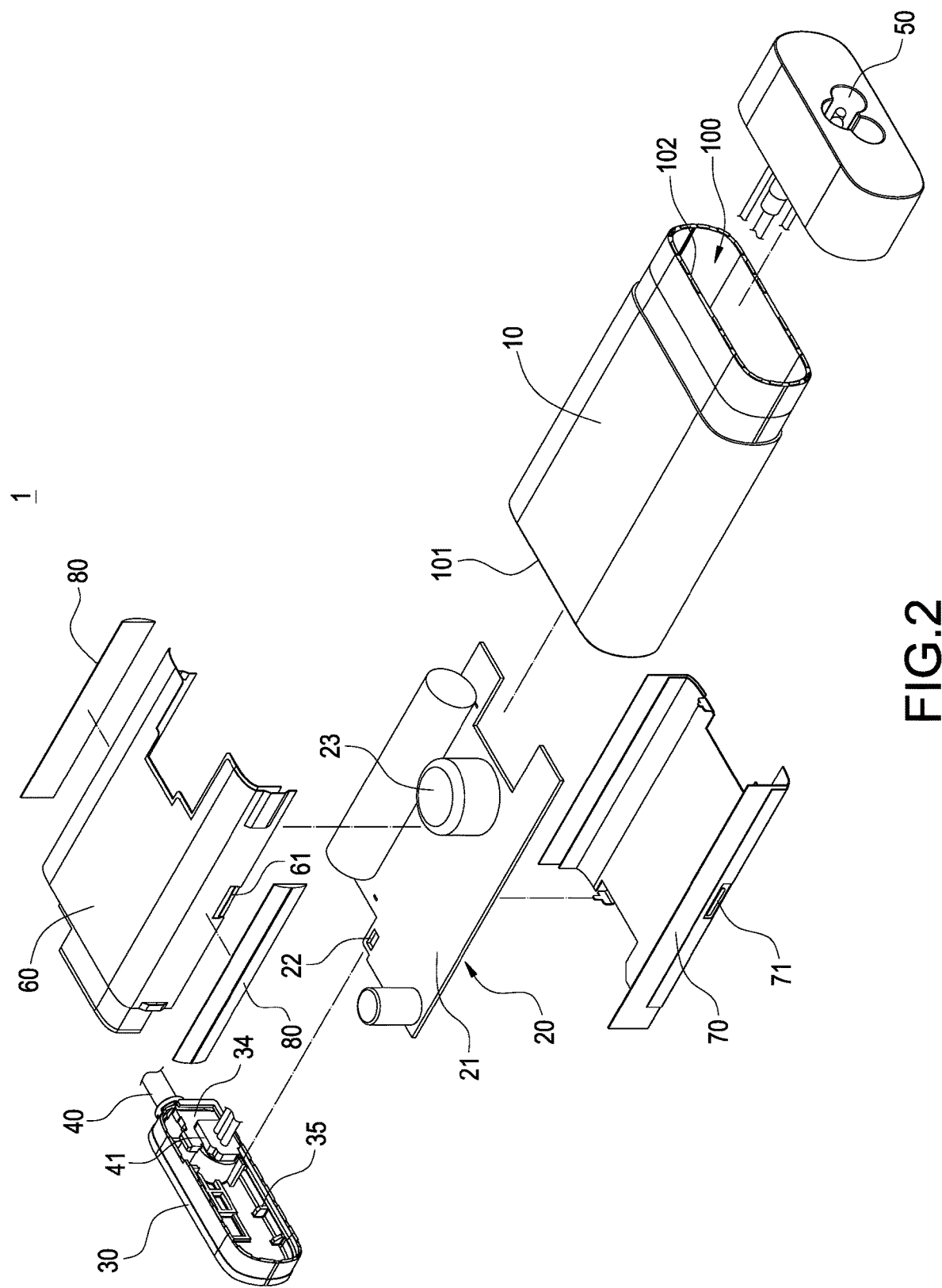
FIG. 2 is a perspective explosion schematic view of the power converter of the present invention.
Figure 3:
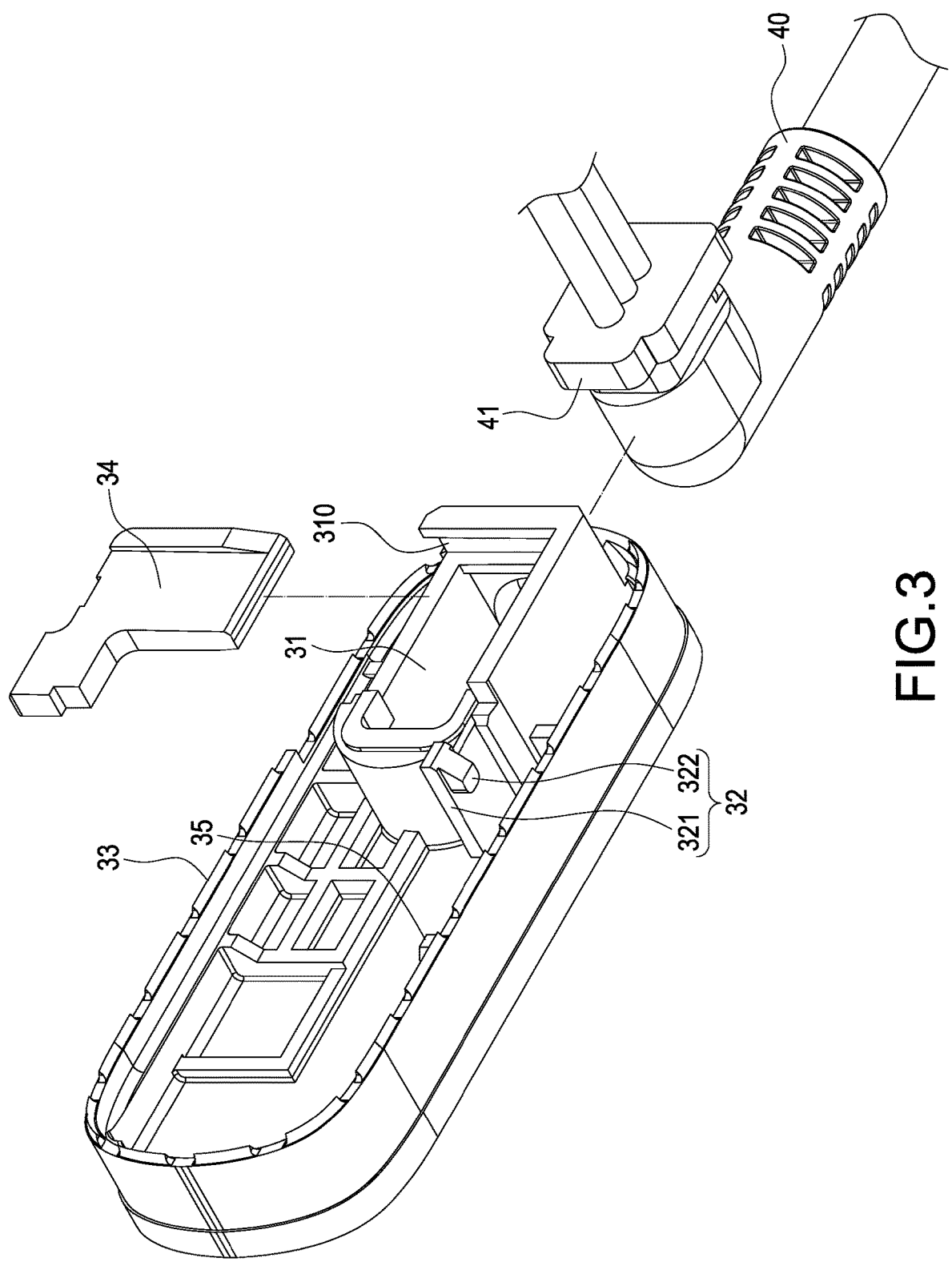
FIG. 3 is a perspective explosion schematic view of the bottom cover and the power cable of the present invention.

Please refer to FIG. 1 to FIG. 3, which depict a perspective schematic view of the power converter of the present invention, a perspective explosion schematic view of the power converter of the present invention and a perspective explosion schematic view of the bottom cover and the power cable of the present invention. The present invention is a power converter 1 including a tubular housing 10, a power module 20, a bottom cover 30, a power cable 40 and a power socket 50. The power module 20 is disposed in the tubular housing 10. The power socket 50 is combined at a side of the tubular housing 10 and the bottom cover 30 is combined at the other side of the tubular housing 10. The power cable 40 is inserted through the bottom cover 30 and electrically with the power module 20 to constitute the power converter 1.

In one embodiment of the present invention, the tubular housing 10 has an accommodation space 100 and a first opening 101 and a second opening 102 located opposite to the accommodation space 100.

The power module 20 is disposed in the accommodation space 100. The power module 20 includes a circuit board 21 and a plurality of electronic components 23 arranged on the circuit board 21, and the circuit board 21 is provided with a first fastening portion 22.

The bottom cover 30 has a docking opening 31, a second fastening portion 32 formed on a side facing the accommodation space 100 and a plurality of first bumps 33 provided as welding line (refer to FIG. 3). Moreover, the bottom cover 30 is pre-positioned on the tubular housing 10 through the second fastening portion 32 engaged with the first fastening portion 22, and the bottom cover 30 is bonded to the first opening 101 through melting the first bumps 33 by ultrasonic welding.

Moreover, the power cable 40 is inserted through the docking opening 31 of the bottom cover 30 to electrically connect with the circuit board 21. In addition, the power socket 50 is combined in the second opening 102 of the tubular housing 10.

In the present embodiment, two ends of the tubular housing 10 are oval-shaped openings separately; in addition, outer contours of the power socket 50 and the bottom cover 30 are oval-shaped separately. However, it is not limited in actual implementation.

In one embodiment of the present invention, the bottom cover 30 further includes a bottom plate 34. In addition, the power cable 40 has a sealing sheet 41 provided at an end inserted through the docking opening 31. The bottom cover 30 has a trough 310 formed on one side of the docking opening 31, and the bottom plate 34 is inserted in the trough 310. Thereby, the bottom plate 34 is sandwiched between the sealing sheet 41 and the bottom cover 30, so a sealed space is formed between the docking opening 31 and the power cable 40.

Specifically, the first fastening portion 22 includes a slot, and the second fastening portion 32 includes an extension arm 321 and a hook 322. One end of the extension arm 321 is connected with the bottom cover 30 and the other end is connected with the hook 322, wherein the bottom cover 30 is pre-positioned on the tubular housing 10 through the hook 322 engaged with the slot. In the present embodiment, the bottom cover 30 has formed with a supporting portion 35 on a side facing the accommodation space 100, and the supporting portion 35 abuts against a side of the circuit board 21 for supporting the circuit board 21. Preferably, the supporting portion 35 is a rib.

It is worth of noting that the circuit board 21 is provided with a plurality of electronic components 23, and the weights of the electronic components 23 on the circuit board 21 are not evenly arranged. In the present embodiment, the weight of the electronic components 23 on the side near the power socket 50 is greater than the weight on the side near the bottom cover 30. Therefore, the disposition of the supporting portion 35 can be used to abut against one side of the circuit board 21 to avoid deflection of the circuit board 21 under uneven weight.

In the embodiment of present invention, the power converter 1 further includes a first EMI shielding mask 60 and a second EMI shielding mask 70. The first EMI shielding mask 60 is disposed above the circuit board 21, and the second EMI shielding mask 70 is disposed at a bottom side of the circuit board 21. Thereby, the first EMI shielding mask 60 and the second EMI shielding mask 70 cover the upper and lower sides of the circuit board 21 respectively to provide a good electromagnetic wave shielding effect for the circuit board 21.

Specifically, a first positioning portion 61, such as a slot or an opening, is provided at one side of the first EMI shielding mask 60; besides, a second positioning portion 71, such as a groove or a bump, is provided at one side of the second EMI shielding mask 70. The first EMI shielding mask 60 and the second EMI shielding mask 70 are combined through positioning of the first positioning portion 61 (such as the opening) and the second positioning portion 71 (such as the bump).

It is worth of noticing that in the present embodiment, the power converter 1 further includes a pair of supporting pieces 80. The pair of supporting pieces 80 are correspondingly coupled to two outer sides of the first EMI shielding mask 60 and the second EMI shielding mask 70 and attached to two inner walls of the tubular housing 10 to position the power module 20 on both sides. Thus, the power module 20 is placed inside the tubular housing 10 without moving.

Figure 4:
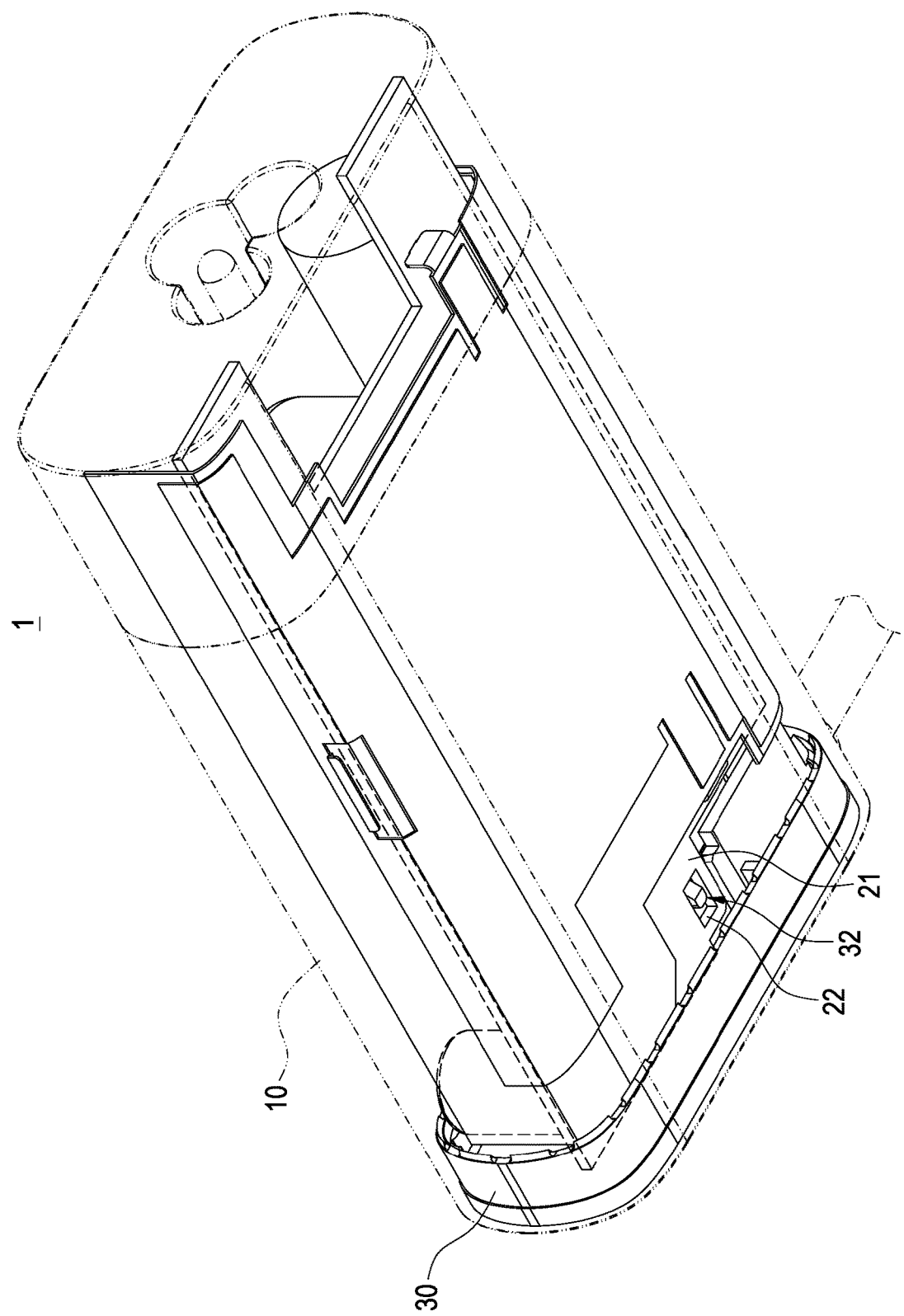
FIG. 4 is a perspective schematic view of another side of the power converter of the present invention.
Figure 5:
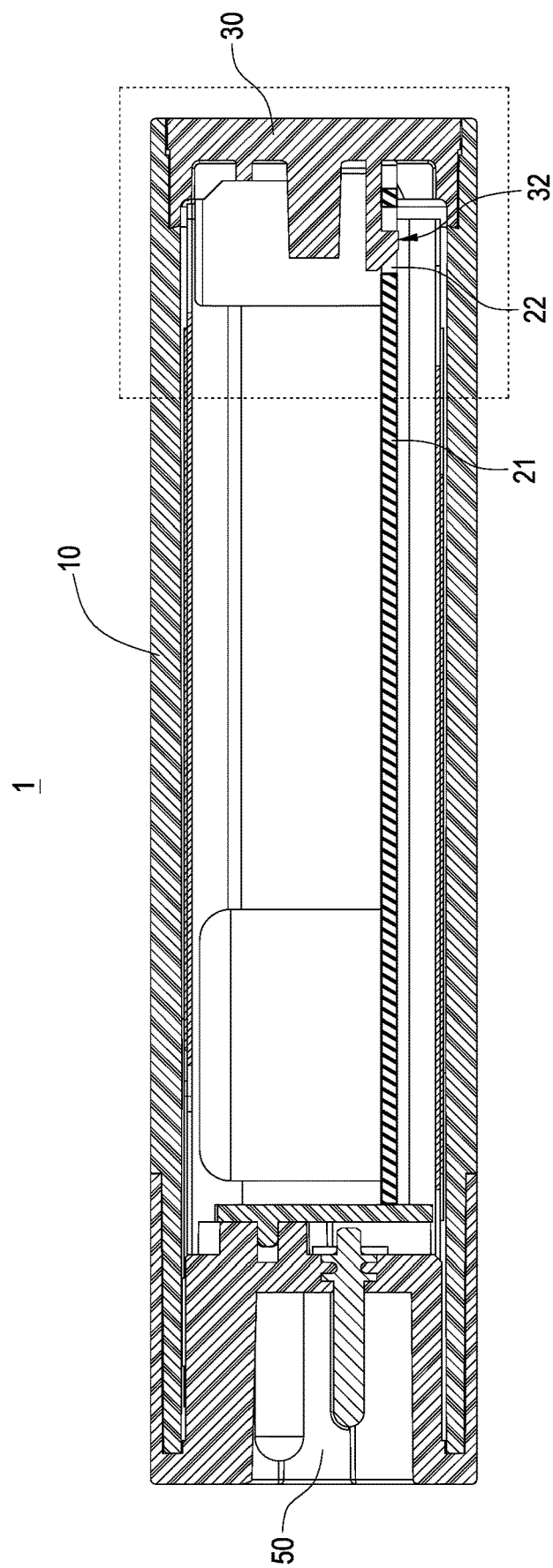
FIG. 5 is a cross sectional view of the power converter of the present invention.

Please also refer to FIG. 4 and FIG. 5, which depict a perspective schematic view of another side of the power converter of the present invention and a cross sectional view of the power converter of the present invention. In the structure of the power converter 1 of the present invention, the bottom cover 30 and the power socket 50 are combined to the opposite sides of the tubular housing 10. Moreover, the bottom cover 30 is pre-positioned on the tubular housing 10 through the second fastening portion 32 engaging with the first fastening portion 22 of the circuit board 21. Subsequently, as shown in FIG. 5, the bottom cover 30 is bonded to the tubular housing 10 by ultrasonic welding.

Figure 6:
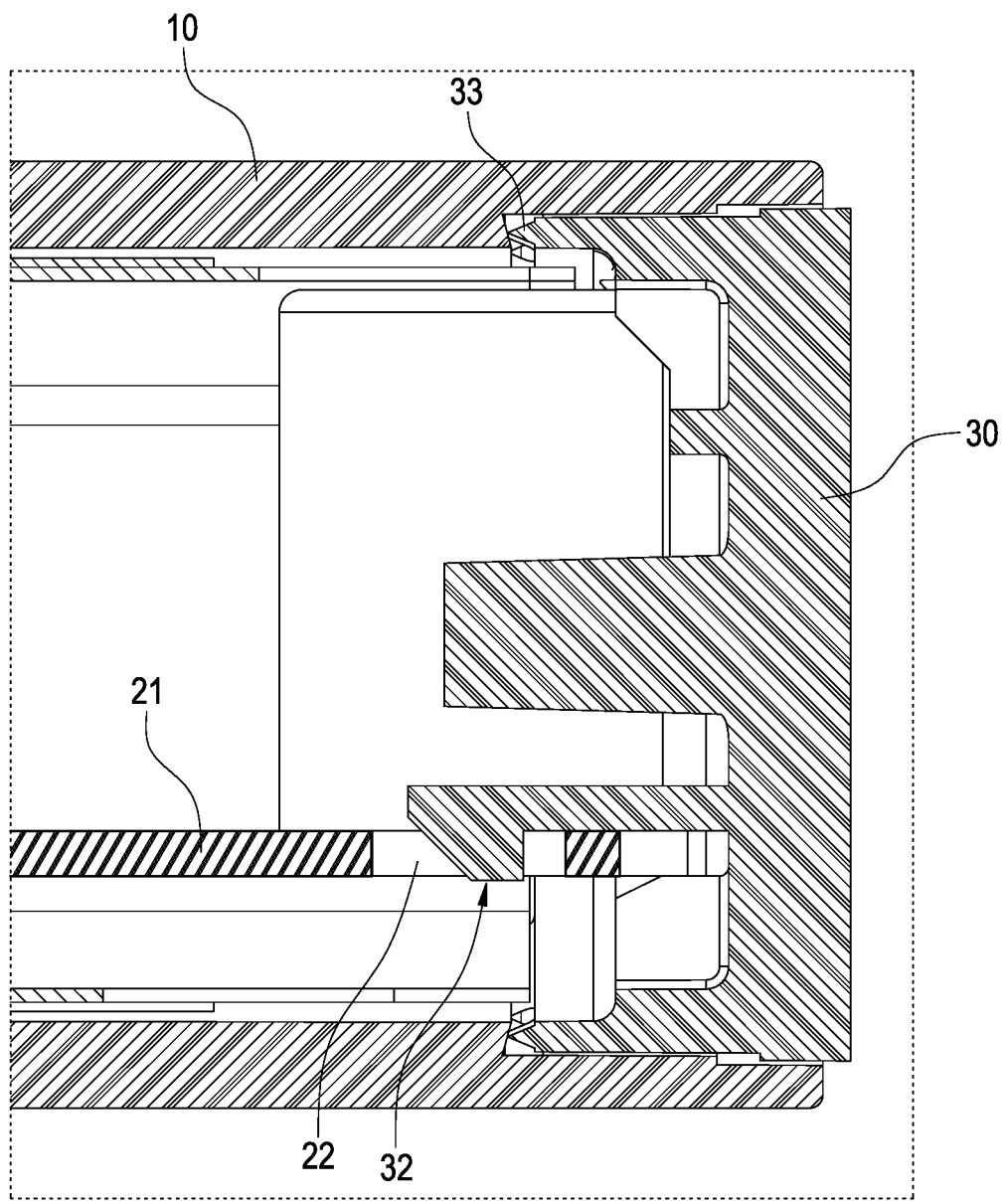
FIG. 6 is a partial cross-sectional view of the power converter before ultrasonic welding of the present invention.
Figure 7:
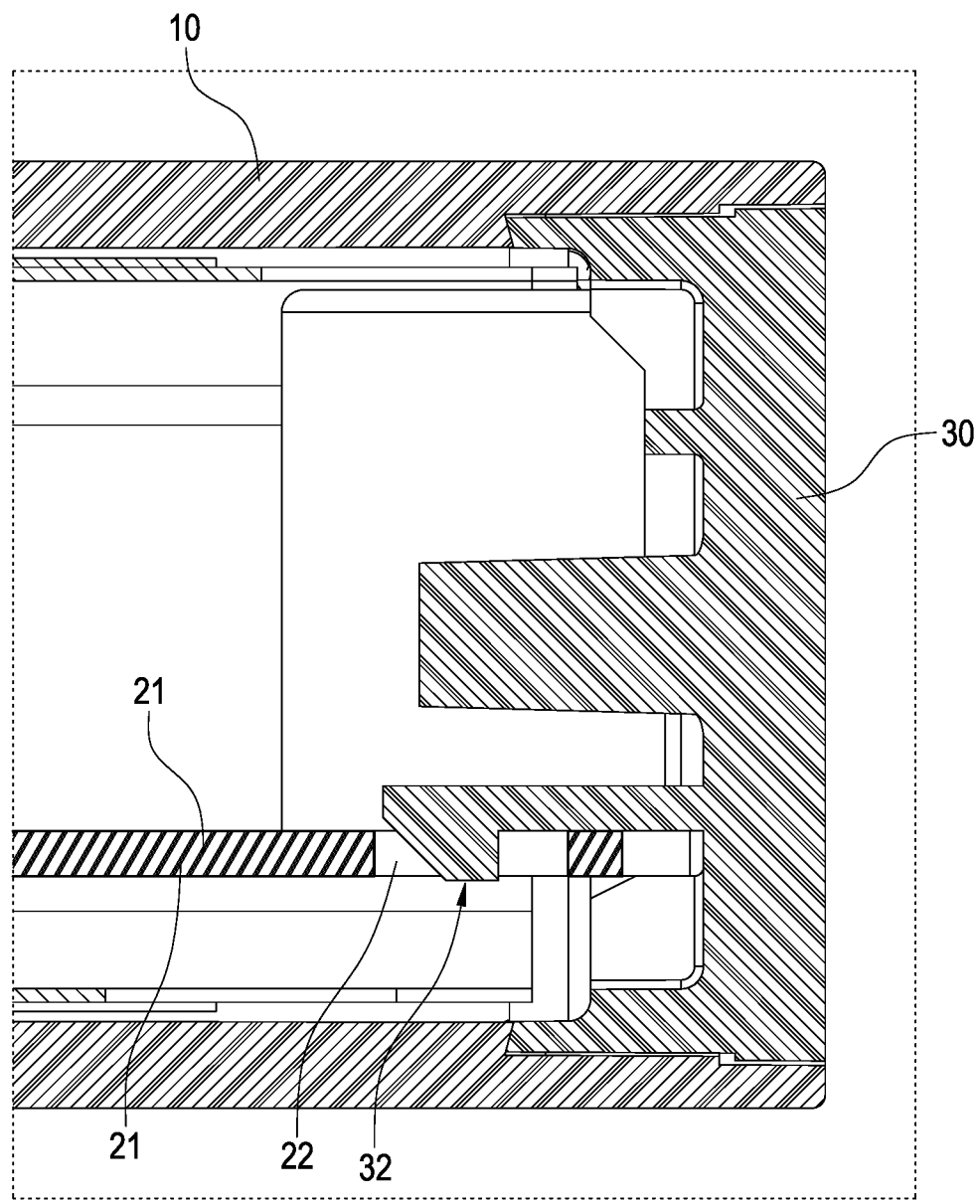
FIG. 7 is a partial cross-sectional view of the power converter after ultrasonic welding of the present invention.

Please further refer to FIG. 6 and FIG. 7, which depict a partial cross-sectional view of the power converter before ultrasonic welding of the present invention and a partial cross-sectional view of the power converter after ultrasonic welding of the present invention. As shown in FIG. 6, the bottom cover 30 has formed with a plurality of first bumps 33 provided as welding line. Besides, the bottom cover 30 is pre-positioned on the tubular housing 10 through the second fastening portion 32 (hook) engaging with the first fastening portion 22 (slot) to facilitate ultrasonic welding. It is worth of noticing that the size of the slot is larger than the size of the hook to provide a margin in the process of ultrasonic welding.

As shown in FIG. 7, in the present embodiment, when the bottom cover 30 is combined with the tubular housing 10 through melting the first bumps 33 by ultrasonic welding, the bottom cover 30 is tightly bonded to the tubular housing 10 through the fusion of the first bumps 33. At the same time, the second fastening portion 32 (hook) will be moved a distance in the first fastening portion 22 (slot). In other words, the first fastening portion 22 and the second fastening portion 32 are engaged together only before the ultrasonic welding process to make the bottom cover 30 and the tubular housing 10 pre-positioned. Thus, the bottom cover 30 will not be separated or detached from the tubular housing 10 for increasing the convenience of assembly. However, after the ultrasonic welding process, there will be a gap between the second fastening portion 32 and the first fastening portion 22 due to the movement of the second fastening portion 32. At this time, there is no fixing or restriction between the second fastening portion 32 and the first fastening portion 22.

Figure 8:
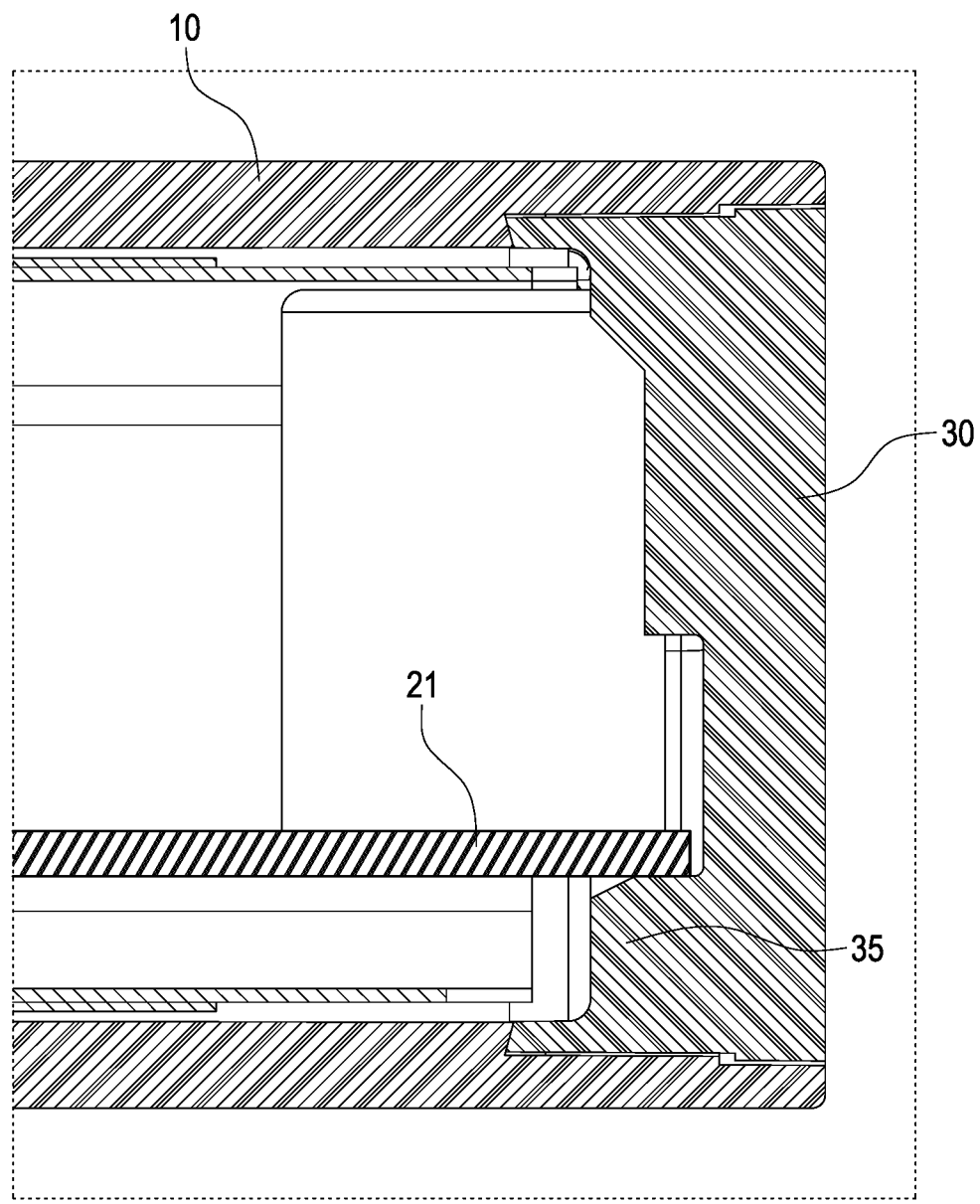
FIG. 8 is a partial cross-sectional view at another location of the power converter after ultrasonic welding of the present invention.

Please further refer to FIG. 8, it depicts a partial cross-sectional view at another location of the power converter after ultrasonic welding of the present invention. The bottom cover 30 of the present invention has formed with a supporting portion 35 (rib), and the supporting portion 35 abuts against one side of the circuit board 21 for supporting the circuit board 21 to avoid deflection of the circuit board 21 under uneven weight.

Figure 9:
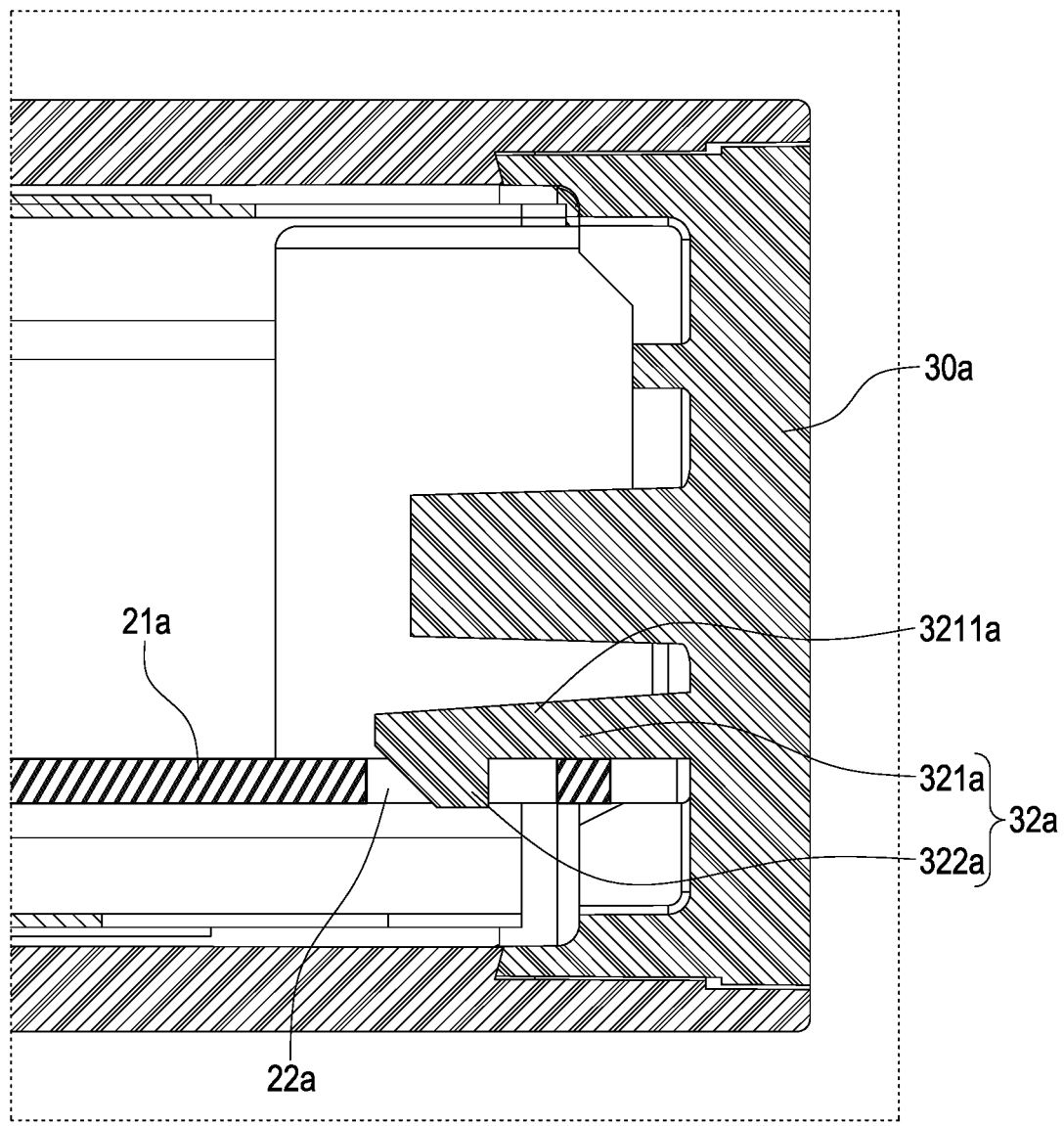
FIG. 9 to FIG. 11 are other embodiments of the second fastening portion of the bottom cover of the present invention.
Figure 10:
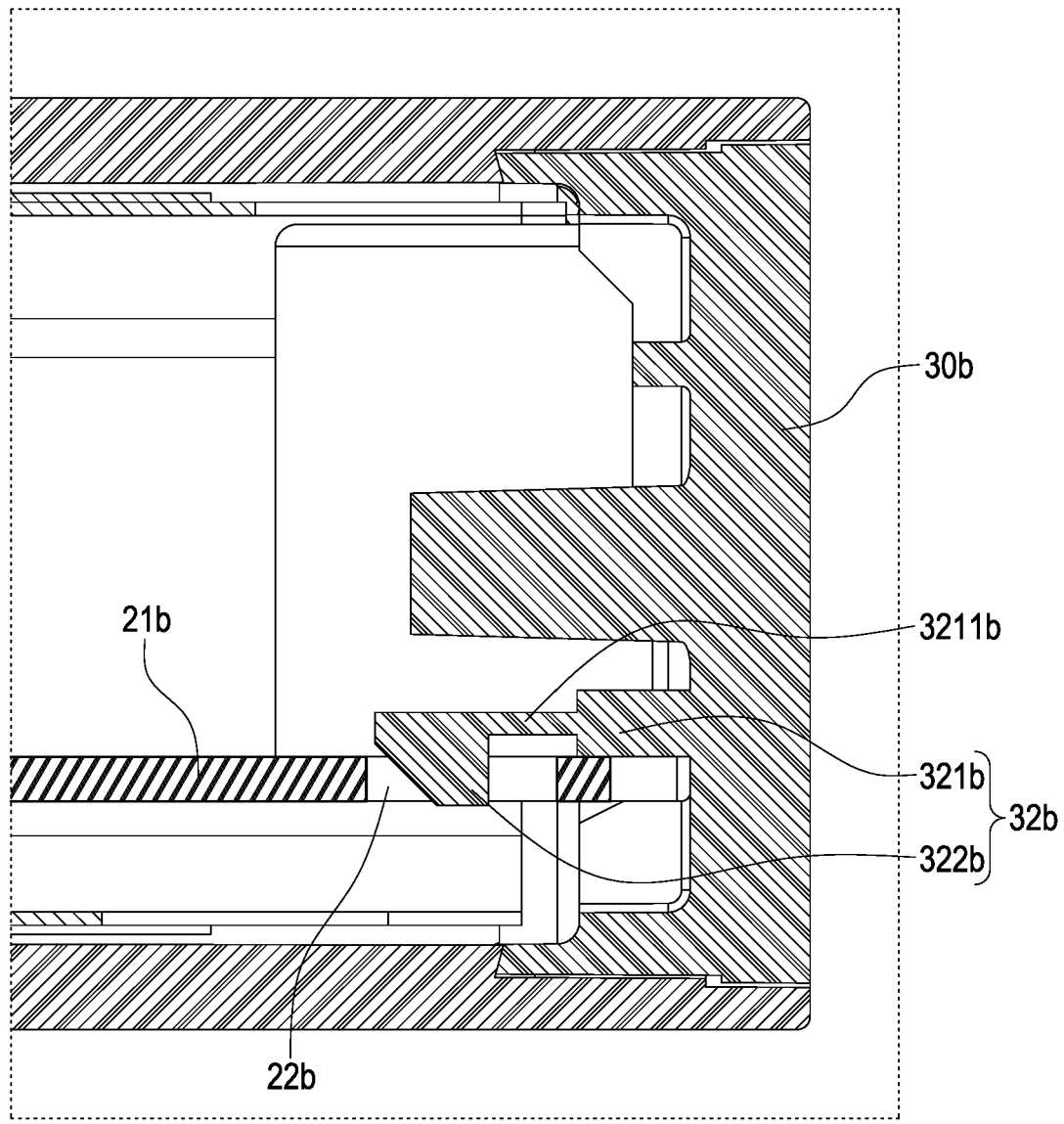
Figure 11:
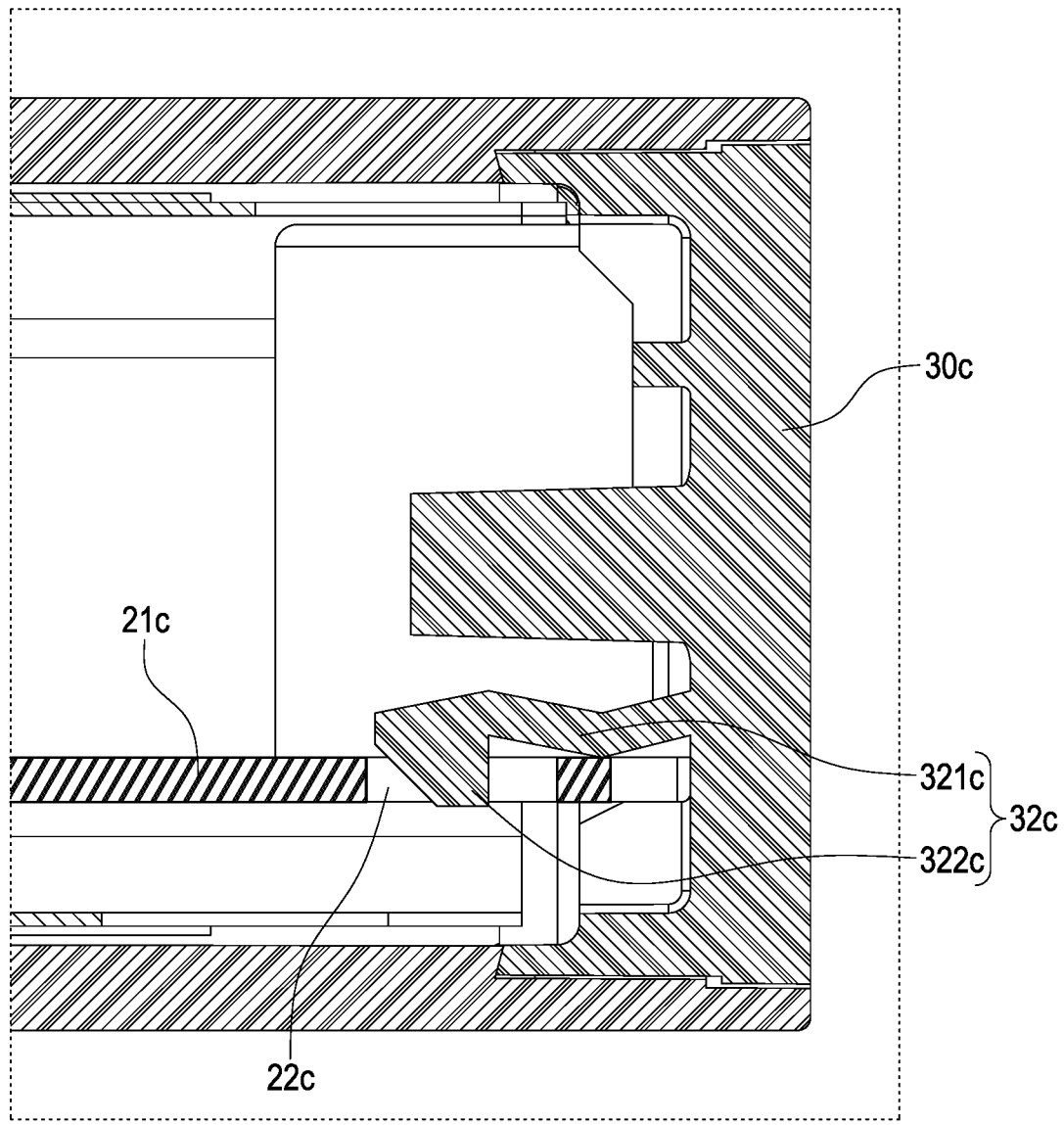

Please further refer to FIG. 9 to FIG. 11, which depict other embodiments of the second fastening portion of the bottom cover of the present invention. In the FIG. 9, the bottom cover 30a is provided with a second fastening portion 32a, and the second fastening 32a is fastened with the first fastening portion 22a of the circuit board 21a. Moreover, the second fastening portion 32a includes an extension arm 321a and a hook 322a, and one end of the extension arm 321a is connected with the bottom cover 30a. This embodiment is different in that one side of the extension arm 321a has an inclined surface 3211a, and the disposition of the inclined surface 3211a can increase the elasticity of the extension arm 321a. Accordingly, when the bottom cover 30a performs ultrasonically welding, the electrical connection of the circuit board 21a will not be affected by the second fastening portion 32a due to vibration.

Moreover, please refer to FIG. 10, in the present embodiment, the bottom cover 30b is provided with a second fastening portion 32b, and the second fastening portion 32b is engaged with the first fastening portion 22b of the circuit board 21b. Furthermore, the second fastening portion 32b includes an extension arm 321b and a hook 322b. This embodiment is different in that the extension arm 321b has a reduction section 3211b. The disposition of the reduction section 3211b can increase the elasticity of the extension arm 321b. Accordingly, when the bottom cover 30b performs ultrasonically welding, the electrical connection of the circuit board 21b will not be affected by the second fastening portion 32b due to vibration.

Furthermore, please refer to FIG. 11, in the present embodiment, the bottom cover 30c is provided with a second fastening portion 32c, and the second fastening portion 32c is engaged with the first fastening portion 22c of the circuit board 21c. In addition, the second fastening portion 32c includes an extension arm 321c and a hook 322c. This embodiment is different in that the extension arm 321c is configured in a wave shape. Accordingly, when the bottom cover 30c performs ultrasonically welding, the electrical connection of the circuit board 21c will not be affected by the second fastening portion 32c due to vibration.

Although the present invention has been described with reference to the preferred embodiment thereof, it will be understood that the invention is not limited to the details thereof. Various substitutions and improvements have been suggested in the foregoing description, and others will occur to those of ordinary skill in the art. Therefore, all such substitutions and improvements are intended to be embraced within the scope of the invention as defined in the appended claims.

What is claimed is:

1. A power converter, comprising:
   a tubular housing having an accommodation space and a first opening and a second opening located opposite to the accommodation space;
   a power module disposed in the accommodation space; and the power module including a circuit board and a plurality of electronic components arranged on the circuit board, and the circuit board provided with a first fastening portion;
   a bottom cover having a docking opening, a second fastening portion formed on a side facing the accommodation space, and a plurality of bumps provided as welding line, wherein the bottom cover is bonded to the first opening through melting the bumps by ultrasonic welding so that the bottom cover is tightly fixed to the tubular housing through fusion of the bumps, and before the ultrasonic welding, the bottom cover is pre-positioned on the tubular housing through the second fastening portion engaged with the first fastening portion;
   a power cable inserted through the docking opening to electrically connect with the circuit board; and
   a power socket combined in the second opening of the tubular housing.

2. The power converter according to claim 1, wherein the first fastening portion includes a slot, and the second fastening portion includes an extension arm and a hook; one end of the extension arm is connected with the bottom cover and the other end is connected with the hook; and the bottom cover is pre-positioned on the tubular housing through the hook engaged with the slot.

3. The power converter according to claim 2, wherein a size of the slot is larger than that of the hook to provide a margin in process of the ultrasonic welding; and the hook will be moved a distance in the slot when the bottom cover is combined with the tubular housing after the ultrasonic welding, so there will be a gap between the hook and the slot due to movement of the hook, and no fixing or restriction between the hook and the slot.

4. The power converter according to claim 1, wherein the bottom cover has formed with a supporting portion on a side facing the accommodation space, and the supporting portion abuts against a side of the circuit board.

5. The power converter according to claim 4, wherein the supporting portion is a rib.

6. The power converter according to claim 1, wherein the bottom cover further includes a bottom plate; the power cable has a sealing sheet provided at an end inserted through the docking opening; and the bottom plate is sandwiched between the sealing sheet and the bottom cover, so that a sealed space is formed between the docking opening and the power cable.

7. The power converter according to claim 6, wherein the bottom cover has formed with a trough on a side of the docking opening, and the bottom plate is inserted in the trough.

8. The power converter according to claim 1, further including a first EMI shielding mask and a second EMI shielding mask, wherein the first EMI shielding mask is disposed above the circuit board, and the second EMI shielding mask is disposed at a bottom side of the circuit board.

9. The power converter according to claim 8, wherein a first positioning portion is provided at a side of the first EMI shielding mask, and a second positioning portion is provided at a side of the second EMI shielding mask; the first EMI shielding mask and the second EMI shielding mask are combined through positioning of the first positioning and the second portion.

10. The power converter according to claim 1, wherein two ends of the tubular housing are oval-shaped openings separately, and outer contours of the power socket and the bottom cover are oval-shaped separately.

11. The power converter according to claim 1, wherein the first fastening portion and the second fastening portion are engaged together only before the ultrasonic welding to make the bottom cover and the tubular housing pre-positioned so the bottom cover will not be separated or detached from the tubular housing for increasing convenience of assembly.

* * * * *